(12) United States Patent
Steimle et al.

(10) Patent No.: US 8,373,221 B2
(45) Date of Patent: Feb. 12, 2013

(54) NANOCLUSTER CHARGE STORAGE DEVICE

(75) Inventors: Robert F. Steimle, Austin, TX (US); Ramachandran Muralidhar, Austin, TX (US); Bruce E. White, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 122 days.

(21) Appl. No.: 11/964,309

(22) Filed: Dec. 26, 2007

(65) Prior Publication Data

US 2008/0105945 A1 May 8, 2008

Related U.S. Application Data

(62) Division of application No. 10/987,047, filed on Nov. 12, 2004, now Pat. No. 7,361,543.

(51) Int. Cl.
*H01L 29/792* (2006.01)

(52) U.S. Cl. . 257/324; 257/325; 257/326; 257/E29.155; 257/E29.159; 257/E29.309

(58) Field of Classification Search .......... 257/316, 257/319–321, 324–325, 326, E29.309, 406, 257/411, E29.155, E29.159, E29.3; 438/592
See application file for complete search history.

(56) References Cited

U.S. PATENT DOCUMENTS

| | | | |
|---|---|---|---|
| 6,057,193 A * | 5/2000 | Wang et al. .......... | 257/316 |
| 6,174,759 B1 | 1/2001 | Verhaar et al. | |
| 6,297,095 B1 | 10/2001 | Muralidhar et al. | |
| 6,320,784 B1 | 11/2001 | Muralidhar et al. | |
| 6,339,002 B1 | 1/2002 | Chan et al. | |
| 6,420,223 B2 | 7/2002 | Camerlenghi | |
| 6,444,545 B1 | 9/2002 | Sadd et al. | |
| 6,580,132 B1 | 6/2003 | Chan et al. | |
| 6,794,711 B2 * | 9/2004 | Kang et al. .......... | 257/315 |
| 6,794,712 B1 | 9/2004 | Fujiwara | |
| 6,808,992 B1 | 10/2004 | Ko et al. | |
| 6,958,265 B2 | 10/2005 | Steimle et al. | |
| 6,964,902 B2 | 11/2005 | Steimle et al. | |
| 7,015,090 B2 | 3/2006 | Okazaki et al. | |

(Continued)

FOREIGN PATENT DOCUMENTS

| | | |
|---|---|---|
| JP | 1999186421 | 7/1999 |
| JP | 2000077618 | 3/2000 |

(Continued)

OTHER PUBLICATIONS

Wolf, S. PhD.; "Endpoint-Detection in CMP"; Silicon Processing for the VLSI Era; Title page & pp. 385-387; vol. 4: Deep Micron Process Technology; Lattice Press, Sunset Beach, CA.

(Continued)

*Primary Examiner* — Zandra Smith
*Assistant Examiner* — Toniae M Thomas

(57) ABSTRACT

An integrated circuit and method of forming an integrated circuit having a memory portion minimizes an amount of oxidation of nanocluster storage elements in the memory portion. A first region of the integrated circuit has non-memory devices, each having a control electrode or gate formed of a single conductive layer of material. A second region of the integrated circuit has a plurality of memory cells, each having a control electrode of at least two conductive layers of material that are positioned one overlying another. The at least two conductive layers are at substantially a same electrical potential when operational and form a single gate electrode. In one form each memory cell gate has two polysilicon layers overlying a nanocluster storage layer.

18 Claims, 9 Drawing Sheets

U.S. PATENT DOCUMENTS

| | | |
|---|---|---|
| 7,091,089 B2 | 8/2006 | Steimle |
| 7,091,130 B1 | 8/2006 | Rao et al. |
| 7,230,294 B2 * | 6/2007 | Lee et al. ............. 257/314 |
| 7,256,125 B2 * | 8/2007 | Yamada et al. ............. 438/592 |
| 7,361,543 B2 | 4/2008 | Steimle et al. |
| 7,476,582 B2 | 1/2009 | Nakagawa et al. |
| 2002/0132414 A1 * | 9/2002 | Lung ............. 438/216 |
| 2003/0030100 A1 * | 2/2003 | Lee et al. ............. 257/315 |
| 2003/0222306 A1 | 12/2003 | Hoefler et al. |
| 2003/0235080 A1 * | 12/2003 | Yaegashi et al. ......... 365/185.22 |
| 2004/0038492 A1 | 2/2004 | Okazaki et al. |
| 2004/0135204 A1 | 7/2004 | Wang et al. |
| 2004/0212019 A1 | 10/2004 | Shinohara et al. |
| 2004/0266107 A1 | 12/2004 | Chindalore et al. |
| 2005/0023604 A1 * | 2/2005 | Kim et al. ............. 257/316 |
| 2005/0098822 A1 | 5/2005 | Mathew et al. |
| 2005/0287729 A1 | 12/2005 | Steimle |
| 2006/0003529 A1 | 1/2006 | Baker |
| 2006/0160311 A1 | 7/2006 | Rao et al. |
| 2006/0199335 A1 | 9/2006 | Rao et al. |

FOREIGN PATENT DOCUMENTS

| | | |
|---|---|---|
| JP | 2001308198 | 11/2001 |
| JP | 2003086766 | 3/2003 |
| JP | 2003218245 | 7/2003 |
| JP | 2004104009 | 4/2004 |
| JP | 2004349680 | 12/2004 |
| JP | 2003218212 | 10/2011 |
| KR | 202095688 | * 12/2002 |
| TW | 200404332 | 12/2001 |
| TW | 546840 | 5/2002 |
| TW | 497223 | 8/2002 |

OTHER PUBLICATIONS

PCT/US05/16495 International Report and Written Opinion mailed Jul. 12, 2006 in PCT Application Corresponding to U.S. Appl. No. 10/876,805.

Solomon, P.M. et al.; "Two Gates are Better Than One"; IEEE Circuits & Devices Magazine; Jan. 2003; pp. 48-62; IEEE.

Wolf, S. PhD.; "Endpoint-Detection in CMP"; Silicon Processing for the VLSI Era; Title page & pp. 385-387; vol. 4: Deep Micron Process Technology; Lattice Press, Sunset Beach, CA. May 28, 2002.

PCT/US04/22508 International Search Report and Written Opinion mailed Mar. 10, 2005 in PCT Application Corresponding to U.S. Appl. No. 10/663,621.

Notice of Allowance mailed Jan. 5, 2005 in U.S. Appl. No. 10/663,621.

Notice of Allowance mailed Jun. 2, 2005 in U.S. Appl. No. 10/663,621.

PCT/US05/16252 International Search Report and Written Opinion mailed Mar. 10, 2005 in PCT Application Corresponding to U.S. Appl. No. 10/876,820.

Office Action mailed Feb. 7, 2006 in U.S. Appl. No. 10/876,820.

PCT/US05/16495 International Search Report and Written Opinion mailed Jul. 12, 2006 in PCT Application Corresponding to U.S. Appl. No. 10/876,805.

Office Action mailed Mar. 23, 2006 in U.S. Appl. No. 10/876,805.

Restriction Requirement mailed Oct. 12, 2006 in U.S. Appl. No. 10/987,047.

Blosse, A.; "PVD Aluminum Dual Damascene Interconnection: Yield Comparison between Counterbore and Self Aligned Approaches"; IITC; 1999; pp. 215-218; IEEE.

Cavins, C, et al; "A Nitride-Oxide Blocking Layer for Scaled SONOS Non-Volatile Memory"; Motorola, Inc.; Jan. 10, 2002; 5 pages.

Cavins, C, et al; "Integrated Stacked Gate Oxide and Interpoly Oxide"; Motorola, Inc.; Nov. 1996; pp. 93-94.

ROC (Taiwan) Patent Application No. 094118848, Filing date Jun. 8, 2005, International Search Report and Written Opinion, dated Feb. 6, 2012.

* cited by examiner

NANOCLUSTER CHARGE STORAGE DEVICE

CROSS-RELATED APPLICATIONS

This application is related to U.S. Pat. No. 6,958,265, filed Sep. 16, 2003 by Robert F. Steimle et al., entitled "Semiconductor Device with Nanoclusters", and assigned to the assignee of record herein. This application is related to U.S. Pat. No. 7,091,130, filed Jun. 25, 2004 by Rajesh A. Rao et al., entitled "Method of Forming a Nanocluster Charge Storage Device", and assigned to the assignee of record herein. This application is related to U.S. Pat. No. 7,091,089, filed Jun. 25, 2004 by Robert F. Steimle et al., entitled "Method of Forming a Nanocluster Charge Storage Device", and assigned to the assignee of record herein.

BACKGROUND

1. Field

The present invention relates to semiconductor devices, and, more particularly, to such devices having nanoclusters.

2. Description of the Related Art

Some devices such as memories (e.g. non volatile memories) utilize discrete charge storage elements called nanoclusters (e.g. of silicon, silicon germanium, aluminum, gold, or germanium) for storing charge in a charge storage location of a transistor. In some examples, the nanoclusters are located between two dielectric layers, a bottom or tunnel dielectric and a top or control dielectric. Examples of such transistors include thin film storage transistors. A memory typically includes an array of such transistors. Examples of nanocluster types include doped and undoped semiconductor nanoclusters such as silicon nanocrystals, germanium nanocrystals and their alloys. Other examples of nanocluster types include various conductive structures such as metal nanoclusters (e.g., gold nanoclusters and aluminum nanoclusters), and metal alloy nanoclusters. In some examples, nanoclusters are from 1-10 nanometers (nm) in size.

Some memories that have charge storage transistors with nanoclusters are implemented on integrated circuits that also include high voltage transistors in the circuitry used for charging and discharging the charge storage locations of the charge storage transistors. Charging or discharging the charge storage locations is used to store one or more bits of information, and may be referred to as programming or erasing. These high voltage transistors typically include a relatively thick gate oxide. This gate oxide may be formed under severe oxidizing conditions. This oxidizing ambient may penetrate the control dielectric of the charge storage transistors thereby undesirably oxidizing the nanocrystals and undesirably increasing the bottom dielectric thickness. Accordingly, an improved method for making a device with nanoclusters is desirable.

BRIEF DESCRIPTION OF THE DRAWINGS

The present invention may be better understood, and its numerous objects, features, and advantages made apparent to those skilled in the art, by referencing the accompanying drawings.

The use of the same reference symbols in different drawings indicates similar or identical items. Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following discussion is intended to provide a detailed description of at least one example of the invention and should not be taken to be limiting of the invention itself. Rather, any number of variations may fall within the scope of the invention which is properly defined in the claims following this description.

FIGS. 1-17 show partial side views of a semiconductor wafer during stages in the manufacture of an integrated circuit having a memory including nanoclusters according to one embodiment of the present invention. As will be described later, the presently disclosed embodiment utilizes devices having a single composite control electrode formed from two conductive layers of material which are at substantially the same electrical potential, while other devices on the same integrated circuit may alternately have a single control electrode formed from one conductive layer of material. For one embodiment, devices which are not using nanoclusters, the first layer of polysilicon is removed before the second layer of polysilicon is deposited; while for nanocluster devices, the first layer of polysilicon is not removed before the second layer of polysilicon is deposited. This results in devices having potentially widely different thicknesses of control electrodes. Note that such a technique allows protection of a top portion of a nanocluster oxide layer, thereby preserving thickness and quality of such oxide layer. Further, as future logic devices are scaled and made smaller, the polysilicon gate thickness will most likely be reduced. By using stacked layers creating an overall thicker conductive layer for the gate electrodes, the longer channel memory cells formed in NVM well 18 can benefit from reduced gate electrode resistance while the non-memory-cell devices can use the thinner gate electrodes.

Figure 1:
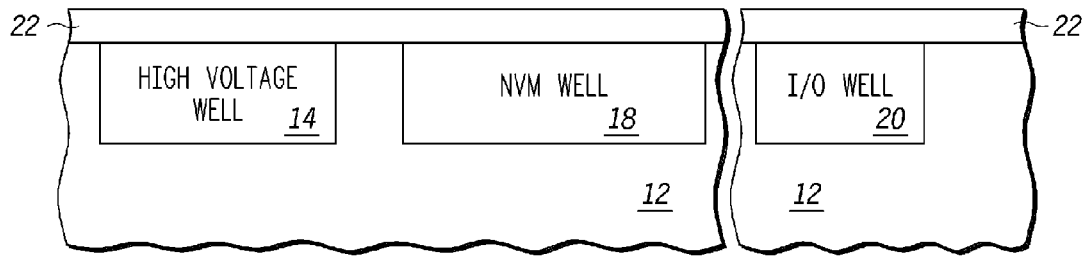
FIGS. 1-17 of the drawings illustrate a series of partial side views of a semiconductor device during various stages of manufacture of an integrated circuit according to one embodiment of the present invention.

FIG. 1 shows a semiconductor device 10. Semiconductor device 10 is an integrated circuit die. Semiconductor device 10 includes substrate 12 which is part of an overall wafer at the presently illustrated stage of manufacture. Semiconductor device 10 also includes various dopant wells 14, 18 and 20 which form part of the functional circuitry of semiconductor device 10. Substrate also includes various pre-formed shallow trench isolation structures (not shown) to separate different devices and to laterally separate the wells discussed herein. Semiconductor device 10 also includes a bottom oxide layer 22.

Dopant wells 14, 18 and 20 may take various forms. Non-volatile memory (NVM) well 18 forms part of storage cell circuitry of a non-volatile memory array. In the illustrated embodiment, NVM well 18 is a p-well in which an array of storage cells will reside. Although in some contexts periphery devices include only high voltage (HV) devices (e.g., cell charge/discharge devices), in the embodiments discussed herein, periphery devices include various devices outside the NVM storage cell array and may include HV devices, integrated circuit die input/output (I/O) devices, and low (LV) voltage devices (e.g., logic devices). High voltage (HV) well 14 forms part of circuitry (e.g., high voltage transistors) for programming and erasing cells of the NVM array. The illustrated HV well 14 is an n-well. Semiconductor device may alternatively or additionally include an HV p-well within a deep n-type isolation well. I/O well 20 forms part of the I/O circuitry of semiconductor device 10. The illustrated I/O well 20 is an n-well. Semiconductor device may alternatively or additionally include an I/O p-well within a deep n-type isolation well. In one embodiment, I/O well 20 is a dual gate oxide (DGO) well.

Silicon dioxide layer 22 provides a tunnel dielectric layer. Other dielectrics may be used for oxide layer 22 such as silicon oxynitride, hafnium oxide, aluminum oxide, lanthanum oxide, or lanthanum silicate. Dielectric layer 22 has been formed over substrate 12, for example, by oxidation or chemical vapor deposition. In one embodiment, bottom dielectric has a thickness of 5-6 nm, but may be of other thicknesses in other embodiments.

Figure 2:
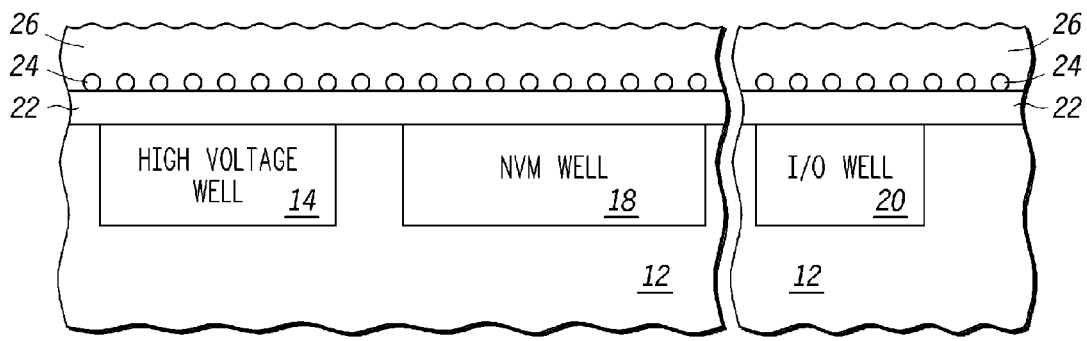

Referring to FIG. 2, a layer of nanoclusters 24 (e.g. of silicon, aluminum, gold, germanium, or a silicon and germanium alloy or other types of conductive material or doped or undoped semiconductive material) is formed over oxide layer 22 by, e.g., chemical vapor deposition techniques, aerosol deposition techniques, spin on coating techniques, or self assembly techniques such as annealing a thin film to form nanoclusters. In one embodiment, the nanoclusters 24 are silicon nanocrystals. In one embodiment where the nanoclusters are utilized in a non-volatile memory, the nanoclusters have a planar density of $1 \times 10^{12}$ cm$^2$ with a mean size of 3 to 7 nm. In some embodiments, nanoclusters are from 2-10 nm in size. However the nanoclusters in other embodiments may be of other sizes and/or other densities. In one embodiment, nanoclusters 24 are separated by average distance generally equal to an average size of clusters. The average distance in one such embodiment is greater than 4 nm. Although nanoclusters 24 are shown as having a uniform size and distribution, nanoclusters 24 will have nonuniform sizes and a nonuniform distribution in actual practice. Nanoclusters 24 will be utilized for implementing charge storage locations in transistors (see FIG. 16) of a non-volatile memory of semiconductor device 10.

After nanoclusters 24 are deposited, a layer of dielectric material (e.g. silicon dioxide, silicon oxynitride, hafnium oxide, aluminum oxide, lanthanum oxide, and lanthanum silicate) is formed over nanocrystals 24 (e.g., by chemical vapor deposition) to form a control dielectric layer 26. In one embodiment, a silicon dioxide layer is deposited over the nanoclusters. Alternately, other dielectrics such as silicon oxynitride, hafnium oxide, aluminum oxide, lanthanum oxide, or lanthanum silicate may be used for layer 26. In another embodiment an oxide-nitride-oxide (ONO) stack of silicon dioxide, silicon nitride, and silicon dioxide may be used for layer 26. In one embodiment, dielectric layer 26 has a thickness of approximately 5-15 nm, but may be of other thicknesses in other embodiments.

In some embodiments, the bottom dielectric 22, nanoclusters 24, and control dielectric 26 may be formed by ion implantation (e.g. silicon or germanium) into a layer of dielectric material (not shown) followed by the annealing of the ions to form nanocrystals in the layer of dielectric material. In other embodiments, bottom dielectric 22, nanoclusters 24 and control dielectric 26 may be formed by recrystallization of a silicon rich oxide layer between two layers of dielectric material to form the nanoclusters. In other embodiments, the nanoclusters may be implemented in multiple layers located above the bottom dielectric. In other embodiments, the nanoclusters are formed by depositing a thin amorphous layer of nanocluster material (e.g. 0.5-2 nm) wherein the resultant structure is annealed in a subsequent annealing process.

Figure 3:
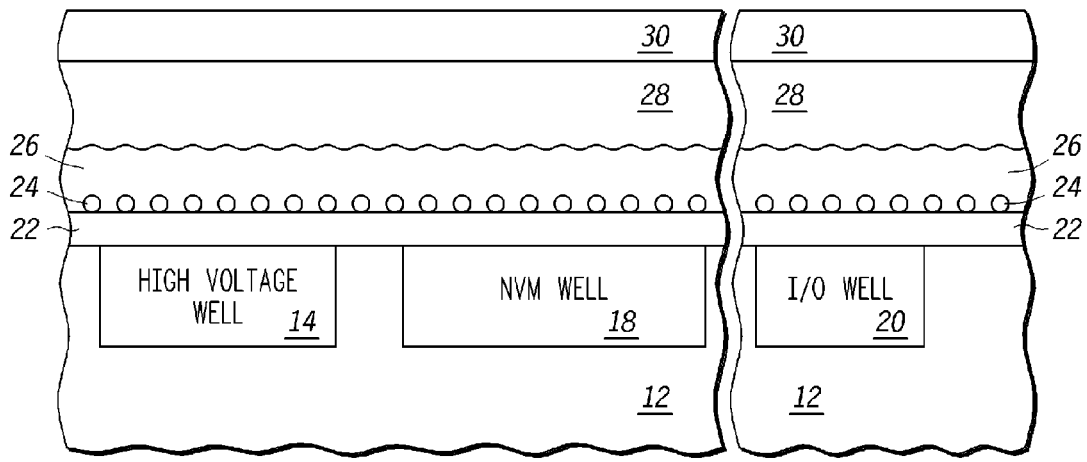

Referring to FIG. 3, a doped polysilicon layer 28 is formed over dielectric layer 26. A portion of polysilicon layer 28 will serve as a gate electrode of an NVM bit cell. The polysilicon layer may be in situ doped (during deposition) or by implantation (after deposition). Note that for some embodiments, layer 28 may be deposited in an undoped form, and doping may be subsequently performed at any desired and feasible point in the fabrication process. Other gate electrode materials may be used such as metals and metal alloys. For example, gate electrode materials may comprise titanium nitride, tantalum nitride, iridium, molybdenum, tungsten, and tungsten carbide. There are a wide variety of materials that may alternately be used as gate electrodes. The examples given above are just a few possible materials. After gate electrode 28 is deposited, a diffusion barrier layer 30 is deposited to prevent oxidation of layer 28. For example, diffusion barrier layer 30 may comprise silicon nitride, titanium nitride, tantalum nitride, or other materials which are resistant to oxidation. Typical thicknesses for layer 28 may range from 25 nm to 200 nm, may alternately range from 30 nm to 70, and may alternately range from 40 to 50 nm. Typical thicknesses for layer 30 may range from 5 nm to 30 nm, and may alternately range from 15 nm to 25 nm. As layer 30 is a sacrificial layer, the thickness of layer 30 may vary significantly from the ranges described above without affecting the performance of any finished devices.

Figure 4:
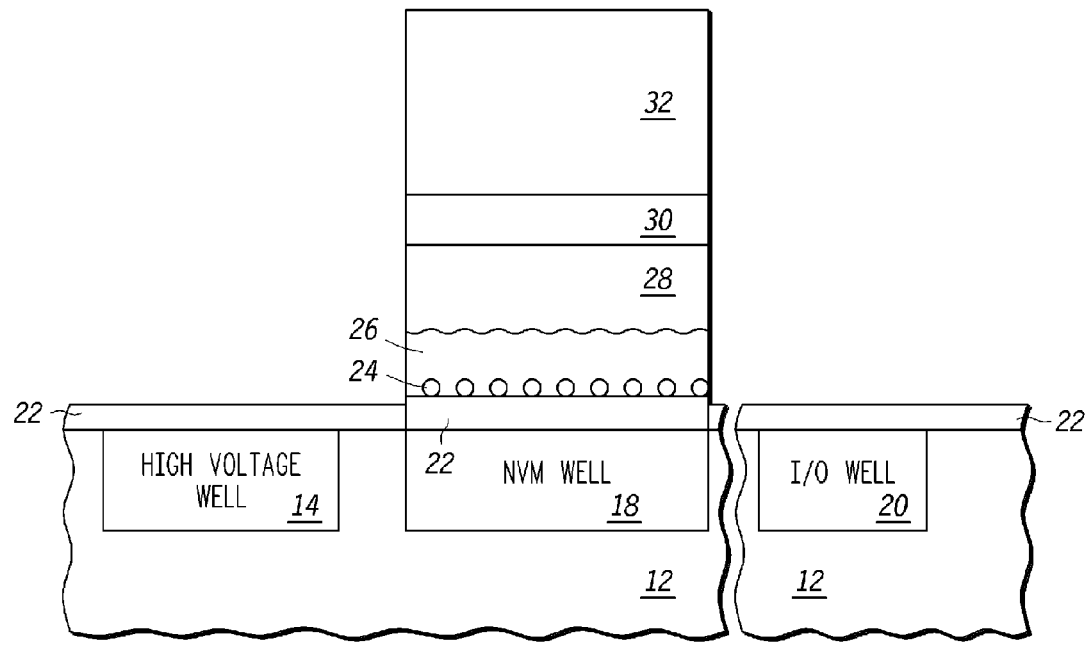

Referring to FIG. 4, a masking layer 32 (e.g., a photoresist) is formed over nitride layer 30. Masking layer 32 protects the gate stack over NVM well 18 and exposes portions of layers 30, 28, 26, 24 and 22 from other areas of semiconductor device 10. Nitride layer 30, polysilicon layer 28, dielectric layer 26 and nanocluster layer 24 are subsequently removed. Part of layer 22 is also subsequently removed. In one embodiment, reactive ion etching is used to remove layers 30, 28, 26, 24 and 22.

Figure 5:
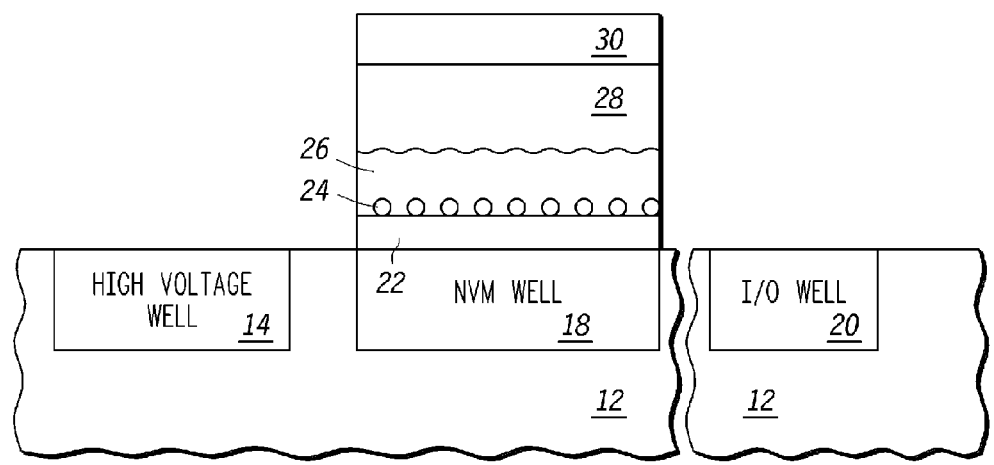

Referring to FIG. 5, masking layer 32 has been removed to expose the nitride layer 30, and the remainder of the exposed portions of tunnel dielectric layer 22 have been removed to expose the substrate. In an embodiment in which tunnel dielectric layer 22 is silicon dioxide, the removal may be performed via a wet etch using dilute hydrofluoric acid.

Figure 6:
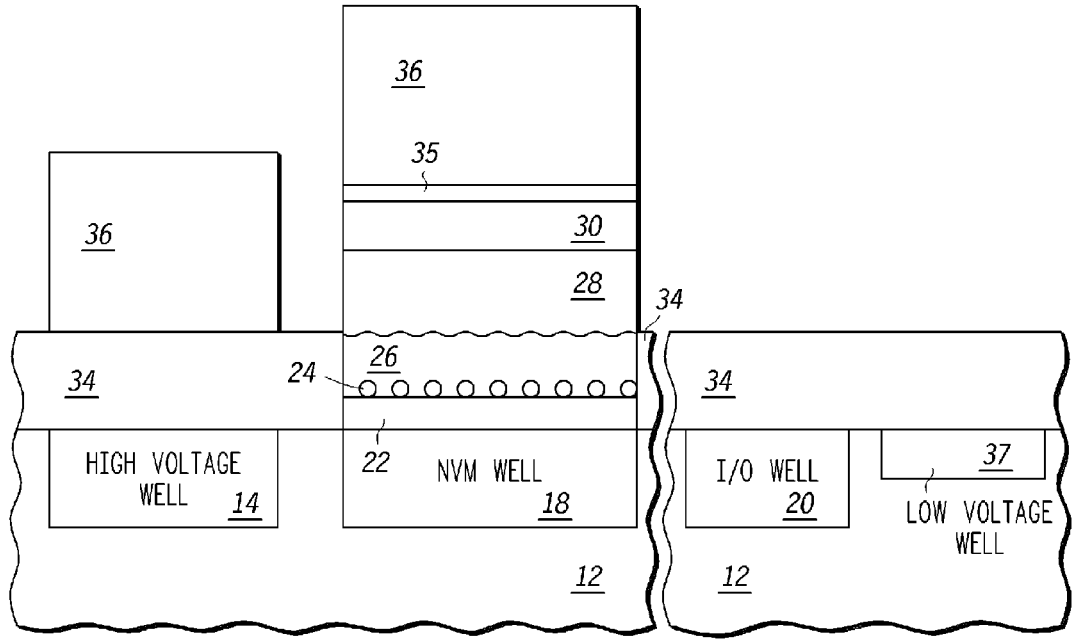

Referring to FIG. 6, the high voltage device oxide layer 34 is formed. For example HV oxide layer 34 may be grown by oxidation in oxygen or steam. One exemplary oxide layer 34 is silicon dioxide having a thickness between 5 and 15 nm. Oxide layer 35 is concomitantly grown over nitride layer 30, typically having a smaller thickness. During this aggressive oxidation step, the nitride layer 30 serves as a diffusion barrier and protects the underlying nanoclusters 24, the polysilicon layer 28, and tunnel dielectric 22 from deleterious oxidation. Such oxidation, if allowed to occur, can adversely influence the NVM device performance since programming and erasing of the nanoclusters is very sensitive to the dielectric layer 22 thickness and the nanocluster size.

Subsequently, the low voltage device wells 37 for general logic circuitry are formed by implantation into substrate 12. A conventional implantation process follows the opening of the low voltage areas by a masking step. The HV oxide layer 34 serves as a sacrificial oxide for the low voltage well implants. The logic well is activated typically by a rapid thermal annealing process.

After formation of the logic wells 37, masking layer 36 (e.g., a photoresist) is formed over HV oxide layer 34 to protect portions of the HV oxide layer over the HV device well 14 and over the NVM well 18 to expose other portions of the HV oxide layer. Alternate embodiments may use masking layer 36 over all areas except for the portion of oxide layer 34 over I/O well 20. Masking layer 36 may be used to protect the HV oxide layer 34 over the HV device well 14 and to protect the oxide layer 35 over the NVM well 18 while exposing the oxide layer 34 over I/O well 20.

Figure 7:
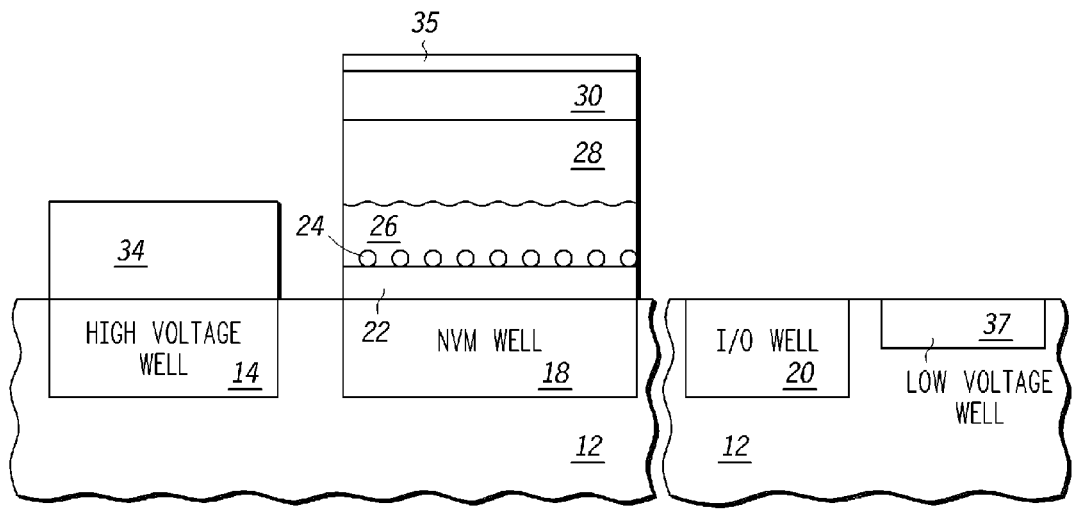

Referring to FIG. 7, exposed portions of the HV oxide layer 34 are removed via a wet etch using dilute hydrofluoric acid. Oxide layer 35 is not removed. After the exposed portion of the HV oxide layers 34 is removed, the masking layer 36 is also removed.

Figure 8:
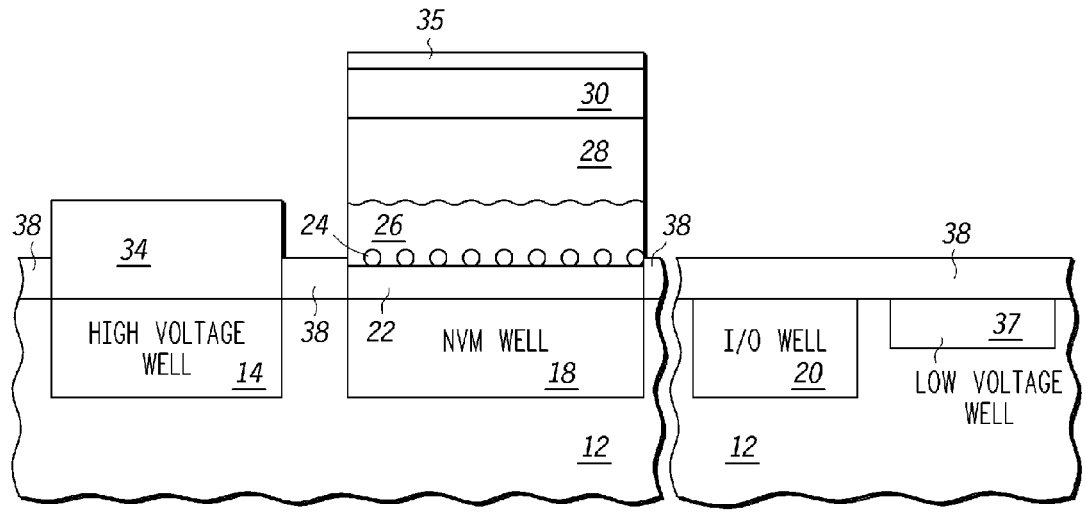

Referring to FIG. 8, I/O device oxide layer 38 is formed. Although other methods may be used, oxide layer 38 is typically grown by oxidation in oxygen. Other oxygen compounds such as $N_2O$ and NO may be used. One exemplary oxide layer 38 is silicon dioxide. I/O oxide layer 38 is generally slightly thinner than HV oxide layer 34, having a thickness between 4 and 8 nm. HV oxide layer 34 is naturally thickened during the growth of I/O oxide layer 38. During this oxidation step, the nitride layer 30 again serves as a diffusion barrier and protects the underlying nanoclusters 24, polysilicon layer 28, and tunnel dielectric 22 from deleterious oxidation. Such oxidation, if allowed to occur, can adversely influence the NVM device performance since programming and erasing of the nanoclusters is very sensitive to the dielectric layer 22 thickness and the nanocluster size.

Figure 9:
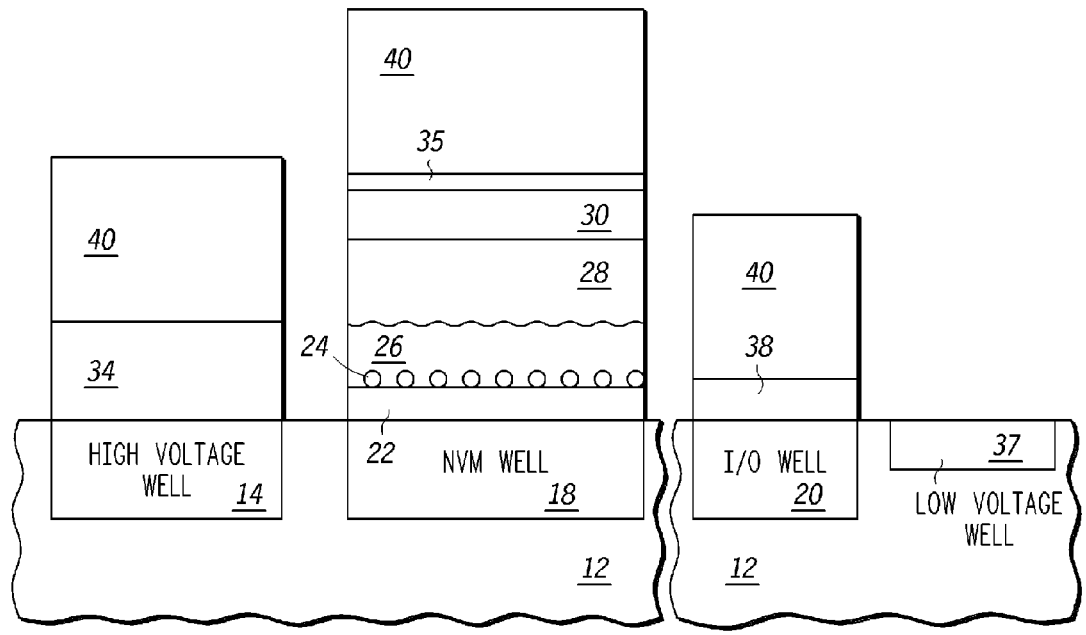

Referring to FIG. 9, masking layer 40 (e.g., a photoresist) is formed over I/O oxide layer 38 to protect I/O oxide layer 38, is formed over HV oxide layer 34 to protect portions of the HV oxide layer 34, and is formed over the NVM well 18 region to protect oxide layer 35. Alternate embodiments may use masking layer 40 over all areas except for the portion of oxide layer 34 over LV well 37. Masking layer 40 may be used to protect the HV oxide layer 34 over the HV device well 14, to protect the oxide layer 35 over the NVM well 18, and to protect the I/O oxide layer 38 over the I/O well 20, while exposing the oxide layer 34 (not shown) over LV well 37. Next, the exposed portions of HV oxide layer 34 are removed using, for example, a wet etch of dilute hydrofluoric acid.

Figure 10:
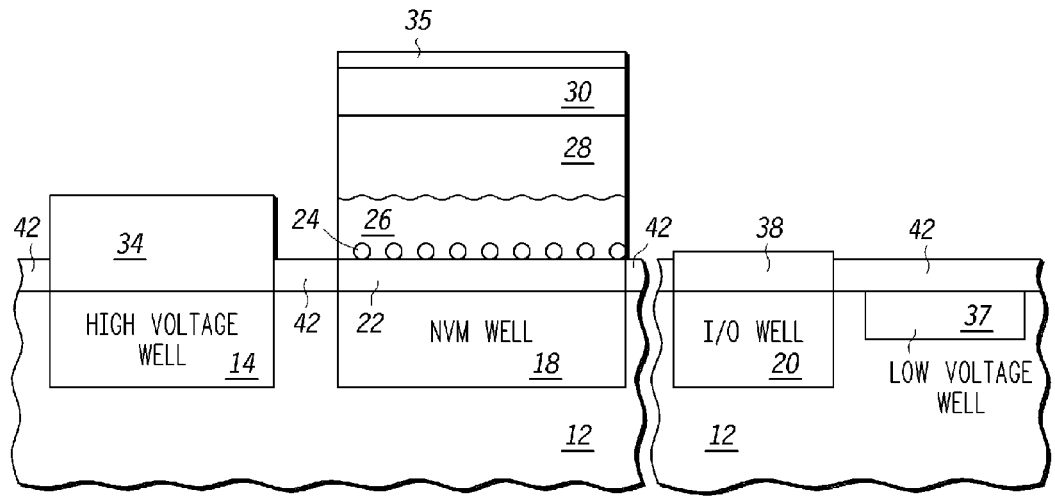

Referring to FIG. 10, all of photoresist layer 40 is removed. Low voltage (LV) oxide 42 is formed. Although other methods may be used, oxide layer 42 is typically grown by oxidation in oxygen, $N_2O$ or NO. One exemplary oxide layer 42 is silicon dioxide. LV oxide layer 42 is generally slightly thinner than HV oxide layer 34 and I/O oxide layer 38, having a thickness between 1.5 and 3 nm. HV oxide layer 34 and I/O oxide layer 38 may be naturally thickened during the growth of LV oxide layer 42. During this oxidation step, the nitride layer 30 again serves as a diffusion barrier and protects the underlying nanoclusters 24, polysilicon layer 28, and tunnel dielectric 22 from any further oxidation.

Figure 11:
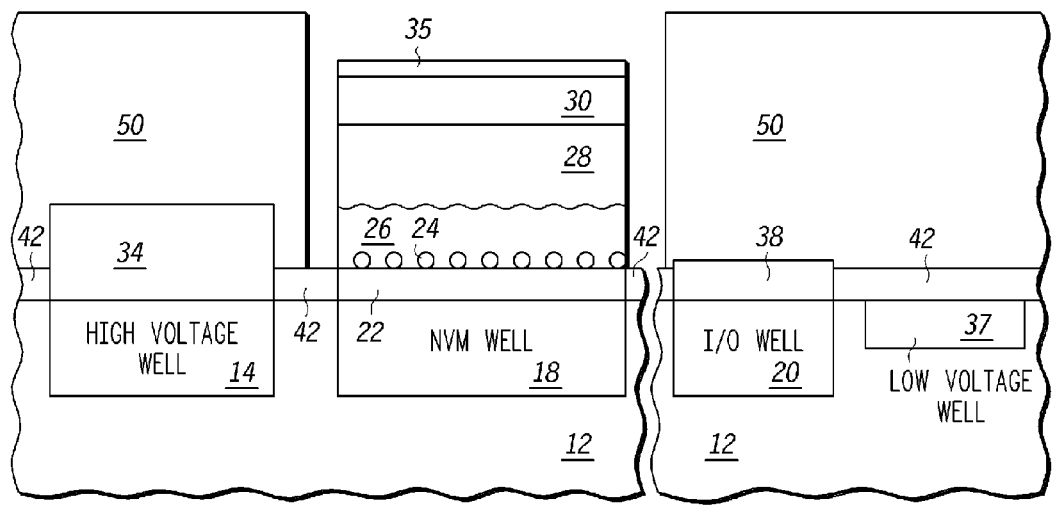

Referring to FIG. 11, a masking layer 50 (e.g., a photoresist) is formed over all areas except the regions having nitride layer 30 and oxide layer 35. Masking layer 50 delineates the areas in which nitride layer 30 and oxide layer 35 will be subsequently removed.

Figure 12:
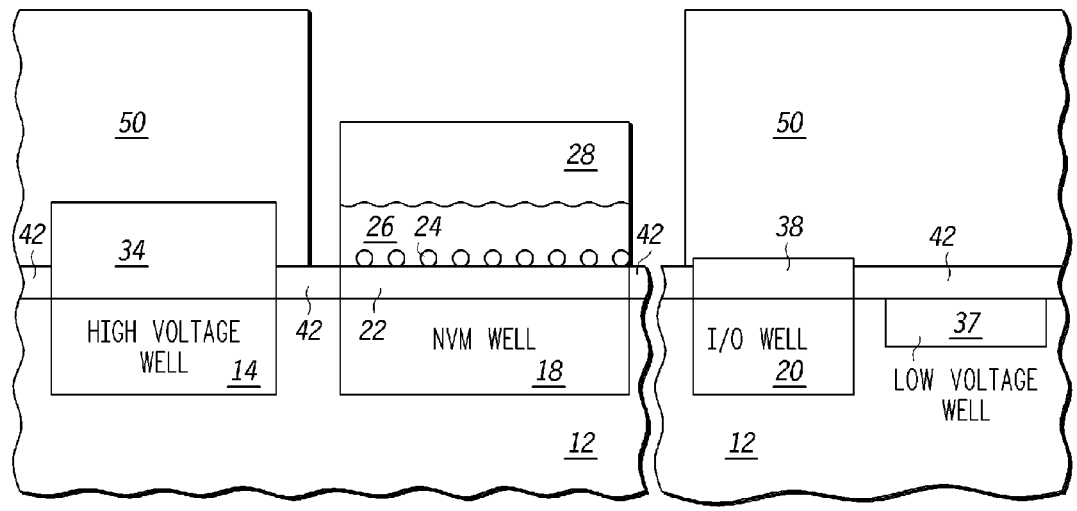

Referring to FIG. 12, the thin oxide layer 35 and nitride layer 30 are etched over the NVM area using, for example, a dry etch (e.g. reactive ion etching, a wet etch, or combination thereof. In one embodiment, the etch is stopped as a change in chemistry of the materials being etched is detected. In one embodiment, dilute hydrofluoric acid is used to remove thin oxide layer 35. Masking layer 50 is subsequently removed, and then hot phosphoric acid is used to remove nitride layer 30. In an alternate embodiment, a single dry etch process may be used to remove both thin oxide layer 35 and nitride layer 30. Masking layer 50 is subsequently removed. In some embodiments, layer 30 may act as an oxidation barrier if layer 28 is capable of being oxidized. In alternate embodiments, if layer 28 is capable of being oxidized, this oxidation may be removed (e.g. using a wet or dry etch) and thus layer 30 may not be needed or present to act as an oxidation barrier layer. In other embodiments in which layer 28 is not capable of being oxidized, layer 30 may not be used for this oxidation barrier purpose, or may instead not be used at all.

Figure 13:
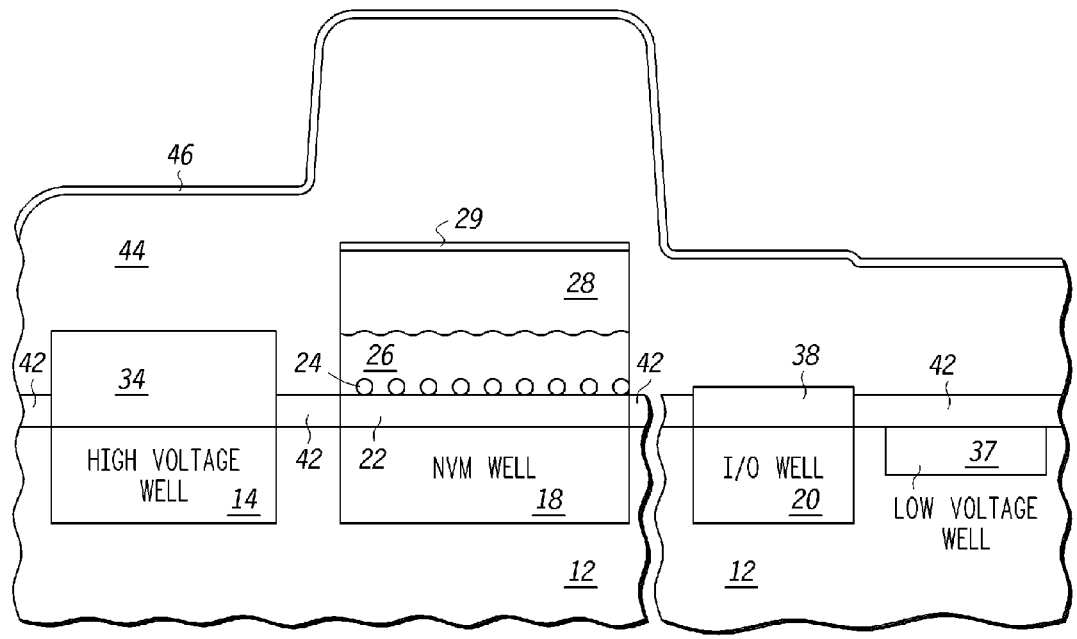

Referring to FIG. 13, a doped polysilicon layer 44 is formed over substrate 12. In the illustrated embodiment, polysilicon layer 44 is deposited over LV oxide layer 42, HV oxide layer 34, I/O oxide layer 38 and the first polysilicon layer 28. Portions of polysilicon layer 44 will serve as the single layer gate electrodes of the HV, LV and I/O devices. Other portions of polysilicon layer 44 will serve as the second layer of polysilicon (overlying polysilicon layer 28) used to form a single composite gate electrode of NVM devices. Typical thicknesses for layer 44 may range from 50 nm to 200 nm, may alternately range from 80 nm to 150, and may alternately range from 100 to 150 nm.

Alternate embodiments may have an oxide layer 29 interposed between polysilicon layer 28 and polysilicon layer 44. In one embodiment, the oxide layer 29 may be a native oxide formed when polysilicon layer 28 is exposed to ambient air. Note that a thin oxide layer between polysilicon layers 28 and 44 does not significantly degrade the performance of resulting devices due to the rapid direct quantum mechanical tunneling that can occur, under certain conditions, across the oxide layer 29. However, if the oxide layer 29 becomes too thick (e.g. more than substantially 2 nm), then the performance of resulting devices may in fact be significantly degraded. In one embodiment, a dilute hydrofluoric acid clean may be used to passivate the surface of polysilicon layer 28 before the deposition of polysilicon layer 44 in order to minimize the thickness of oxide layer 29. In an alternate embodiment, an insitu high temperature bake (e.g. greater than 800 degrees Celsius) in a reducing ambient (e.g. hydrogen, or certain hydrogen-containing compounds) may be used to remove all or a portion of oxide layer 29 prior to depositing polysilicon layer 44.

In one embodiment, polysilicon layer 44 is approximately three times as thick as polysilicon layer 28. In alternate embodiments, the ratio of the thickness of polysilicon layer 44 to the thickness of polysilicon layer 28 ranges from approximately 4:1 to approximately 1:1.

In other embodiments, different materials with appropriate thicknesses may be used for layers 28 and 44. As layers 28 and 44 are used for control electrodes (e.g. gate electrodes), the polysilicon layer 44 may be in situ doped (during deposition) or may be doped by implantation (after deposition). Alternately, other gate electrode materials may be used such as metals and metal alloys. For example, gate electrode materials may comprise titanium nitride, tantalum nitride, iridium, molybdenum, tungsten, and tungsten carbide. Again, there are a wide variety of materials that may alternately be used as gate electrodes. The examples given above are just a few possible materials. Note that layers 28 and 44 may comprise the same or different materials in any desired combination.

After polysilicon layer 44 is deposited, an anti-reflective coating (ARC) 46 is deposited. In one embodiment, silicon nitride or any other suitable material may be used for layer 46 to provide the anti-reflective coating.

Figure 14:
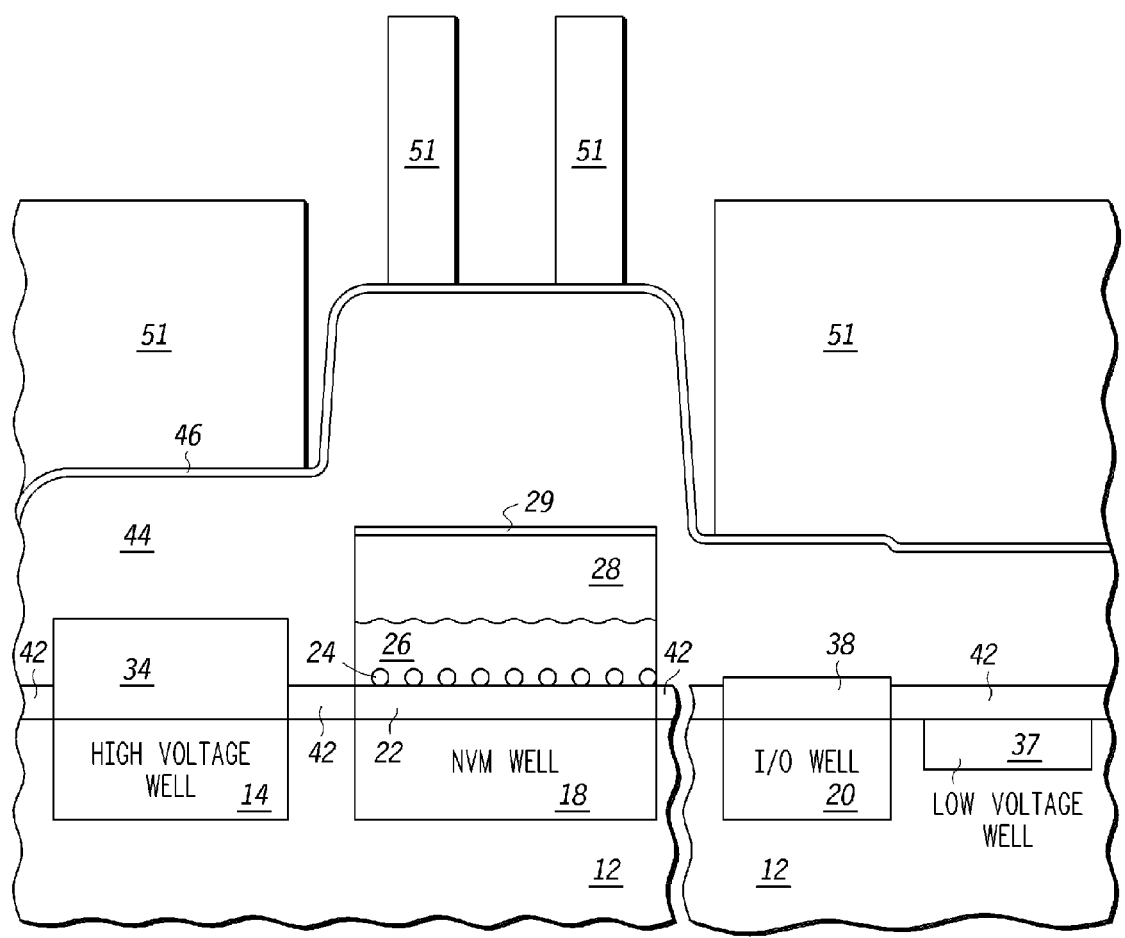

Referring to FIG. 14, a masking layer 51 (e.g., a photoresist) is formed over all areas except the areas between the gate electrodes in the NVM region over NVM well 18.

Figure 15:
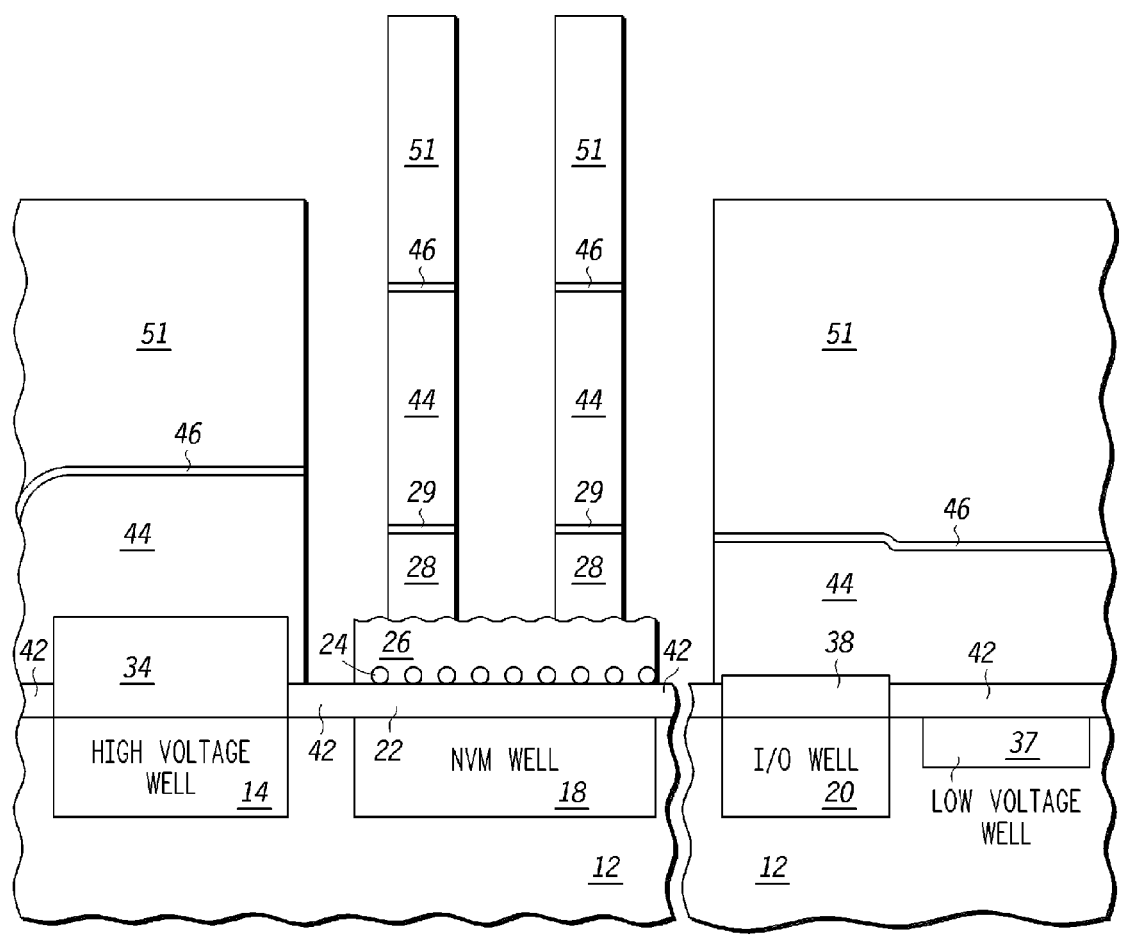

Referring to FIG. 15, the exposed portions of layers 46, 44, 29, and 28 are removed using, for example, an anisotropic plasma etch. During this gate patterning step, non-gate-electrode portions of ARC layer 46, polysilicon layer 44, interfacial layer 29, and polysilicon layer 28 overlying selected NVM areas are removed, while the HV, LV, and I/O regions are not affected due to the masking layer 51.

Figure 16:
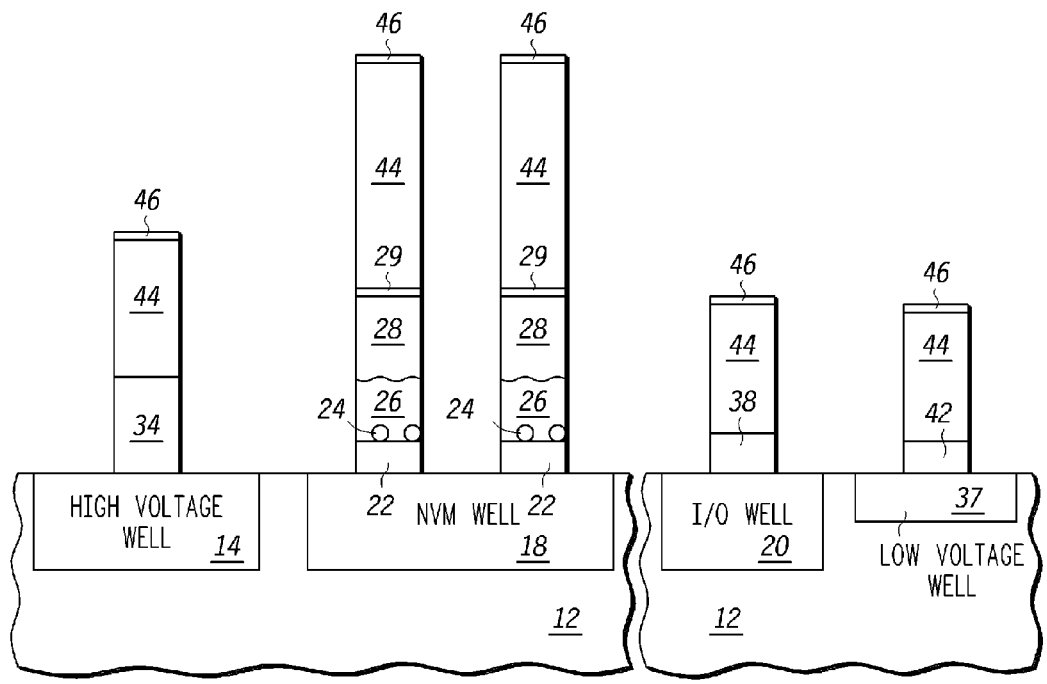

Referring to FIG. 16, masking layer 51 is removed. A subsequent masking layer (e.g., a photoresist) (not shown) is used to pattern gate electrodes for devices in HV, LV, and I/O regions. In the illustrated embodiment, the NVM region is not affected by this patterning of gate electrodes in the HV, LV, and I/O regions.

Figure 17:
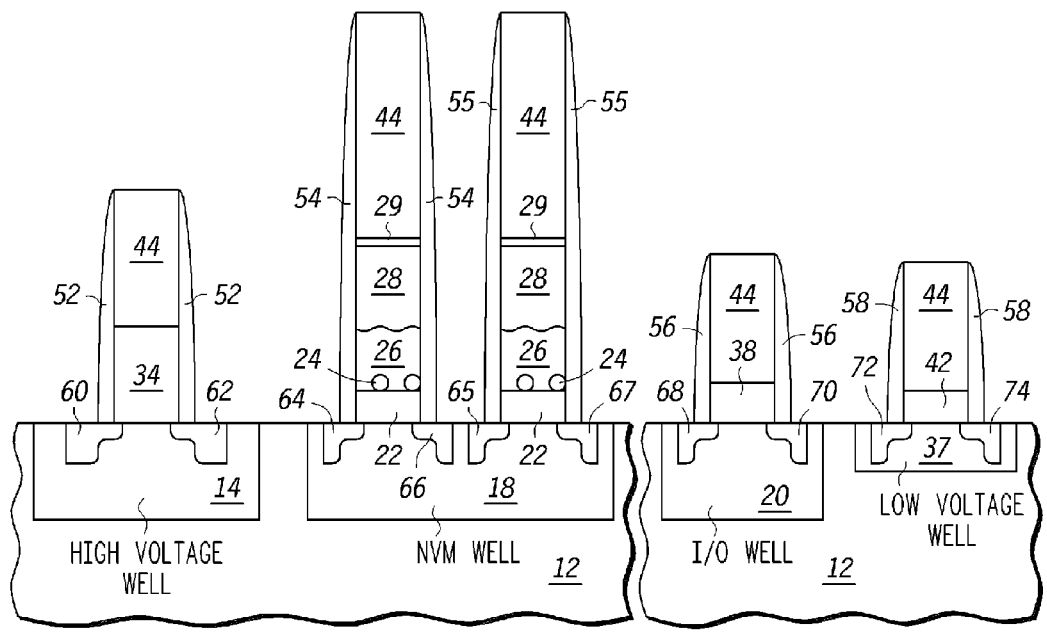

Referring to FIG. 17, conventional processing may be used to complete the NVM cell and periphery devices. Subsequent to the formation of all of the gate electrodes as described in FIGS. 16 and 17, standard CMOS processing techniques are used to form source/drain extensions, side-wall spacers and source/drain regions. As illustrated, 60 and 62 represent source/drain regions and extension of an HV device, 64, 65, 66, and 67 represent source/drain regions and extension of an NVM cell, 68 and 70 represent source/drain regions and extension of an I/O device, and 72 and 74 represent source/drain regions and extension of an LV device. Side-wall spacers 52 correspond to an HV device, side-wall spacers 54 and 55 correspond to NVM cell devices, side-wall spacers 56 correspond to an I/O device, and side-wall spacers 58 correspond to an LV device.

The above description is intended to describe at least one embodiment of the invention. The above description is not intended to define the scope of the invention. Rather, the scope of the invention is defined in the claims below. Thus, other embodiments of the invention include other variations, modifications, additions, and/or improvements to the above description.

Many of the devices described herein may be conceptualized as having a control terminal which controls the flow of current between a first current handling terminal and a second current handling terminal. One example of such a device is a transistor. An appropriate condition on the control terminal of a transistor causes a current to flow from/to the first current handling terminal and to/from the second current handling terminal. Also, although field effect transistors (FETs) are frequently discussed as having a drain, a gate, and a source, in most such devices the drain is interchangeable with the source. This is because the layout and semiconductor processing of the transistor is frequently symmetrical.

Note that although the embodiments described above use at least one layer for the control electrode in a first region and use at least two layers for the control electrode in a second region, alternate embodiments may use more layers for the device control electrodes.

Although the embodiments illustrated herein have described specific uses of a control electrode comprising a single conductive layer of material and a control electrode comprising at least two conductive layers of material on a same integrated circuit, alternate embodiments may use this structure and method for a wide variety of uses. Using the control electrode comprising at least two conductive layers of material in a non-volatile memory is just one possible use of the present invention. Alternate embodiments of the present invention may use a control electrode comprising at least two conductive layers of material in a circuit that has any desired function. Similarly, the control electrode comprising a single conductive layer of material may be used in a circuit that has any desired function. The circuit functions described herein are merely intended as examples. Note that in alternate embodiments, the intermediate processing that may be performed between the forming of the first conductive layer and the forming of the second conductive layer may be any appropriate and desired steps. The intermediate processing described in detail herein is intended to be an example.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described. Furthermore, when a claim element is described in the claims below as including or comprising "a" feature, it is not intended that the element be limited to one and only one of the feature described. Rather, for example, a claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that the element not be limited to one and only one of the feature described merely by the incidental use of the definite article.

Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Based on the teachings herein, those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

While particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the true spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

The invention claimed is:

1. An integrated circuit comprising:
   a first region having transistors for performing logic functions, each of the transistors having a control electrode comprising a single conductive layer of material;
   a second region having a plurality of memory cells, each of the plurality of memory cells having a control electrode comprising at least two conductive layers of material that are positioned one overlying another, the at least two conductive layers being at substantially a same electrical potential when operational and forming a single control electrode wherein a thin oxide layer of no more than substantially two nanometers is positioned between the at least two conductive layers of the second region; and
   a third region of the integrated circuit comprising high-voltage transistors having a control electrode oxide thickness which is greater than that of the transistors of the first region that perform logic functions.

2. The integrated circuit of claim 1 wherein the high-voltage transistors are further characterized as being input/output transistors.

3. The integrated circuit of claim 1 wherein the second region further comprises:
   a substrate;
   an overlying tunnel oxide layer;
   a layer of electrically isolated nanoclusters overlying the tunnel oxide layer;
   a control dielectric layer overlying the layer of electrically isolated nanoclusters, said substrate, overlying tunnel oxide layer, layer of electrically isolated nanoclusters and the control dielectric layer underlying the control electrode.

4. The integrated circuit of claim 3 wherein the layer of electrically isolated nanoclusters further comprise silicon or silicon-germanium alloy nanoclusters.

5. The integrated circuit of claim 1 wherein each memory cell of the plurality of memory cells is a non-volatile memory cell.

6. The integrated circuit of claim 1 wherein the at least two conductive layers of material comprise a number of conductive layers of material, wherein the number is two.

7. The integrated circuit of claim 6 wherein the at least two conductive layers of material are each polysilicon.

8. The integrated circuit of claim 6 wherein an underlying one of the at least two conductive layers of material is polysilicon and an overlying one of the at least two conductive layers of material is metal.

9. The integrated circuit of claim 6 wherein the at least two conductive layers of material are each metal.

10. The integrated circuit of claim 1 wherein the at least two conductive layers of material comprise a first conductive layer having a first thickness and an overlying second conductive layer having a second thickness, and wherein a ratio of the second thickness divided by the first thickness is in a range from substantially 1:1 to 4:1.

11. The integrated circuit of claim 10 further comprising a thin dielectric layer of less than approximately two nanometers positioned between the at least two conductive layers of material.

12. The integrated circuit of claim 1 wherein the at least two conductive layers of material comprise a same material.

13. The integrated circuit of claim 12 wherein the same material comprises polysilicon.

14. The integrated circuit of claim 12 wherein the at least two conductive layers of material are doped to a same conductivity type.

15. An integrated circuit comprising:
    a first region having transistors for performing logic functions, each of the transistors having a control electrode comprising a single conductive layer of material;
    a second region having a plurality of memory cells, each of the plurality of memory cells having a control electrode comprising at least two conductive layers of material that are positioned one overlying another, the at least two conductive layers being at substantially a same electrical potential when operational and forming a single control electrode;
    a thin oxide layer of no more than substantially two nanometers positioned between the at least two conductive layers of the second region; and
    a third region comprising input/output transistors, the input/output transistors each having a control electrode oxide thickness that is greater than that of the transistors of the first region.

16. An integrated circuit comprising:
    a first region having devices, each of the devices having a control electrode comprising a single conductive layer of material;
    a second region having a plurality of memory cells, each of the plurality of memory cells having a control electrode comprising at least two conductive layers of material that are positioned one overlying another, the at least two conductive layers being at substantially a same electrical potential when operational and forming a single control electrode; and
    a thin dielectric layer of less than approximately two nanometers positioned between the at least two conductive layers of material,
    wherein the at least two conductive layers of material comprise a first conductive layer having a first thickness and an overlying second conductive layer having a second thickness, and wherein a ratio of the second thickness divided by the first thickness is in a range from substantially 1:1 to 4:1.

17. The integrated circuit of claim 16 wherein the at least two conductive layers of material comprise a same material.

18. The integrated circuit of claim 16 wherein the at least two conductive layers of material are doped to a same conductivity type.

* * * * *